(12) United States Patent
Kim

(10) Patent No.: US 7,009,457 B2
(45) Date of Patent: Mar. 7, 2006

(54) MULTI-LOOP OSCILLATOR

(75) Inventor: Kyung Whan Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 148 days.

(21) Appl. No.: 10/731,241

(22) Filed: Dec. 9, 2003

(65) Prior Publication Data
US 2004/0160282 A1  Aug. 19, 2004

(30) Foreign Application Priority Data
Jan. 21, 2003  (KR) .................. 10-2003-0003955

(51) Int. Cl.
*H03B 5/04* (2006.01)
(52) U.S. Cl. ........................ 331/57; 331/185
(58) Field of Classification Search .............. 331/57, 331/74, 49, 185; 327/145, 149
See application file for complete search history.

(56) References Cited

U.S. PATENT DOCUMENTS 5,317,219 A * 5/1994 Lupi et al. .................. 327/262
5,592,126 A * 1/1997 Boudewijns et al. ......... 331/45
6,831,524 B1 * 12/2004 Krawczyk et al. ............ 331/57

* cited by examiner

*Primary Examiner*—Joseph Chang
(74) *Attorney, Agent, or Firm*—Ladas & Parry LLP

(57) ABSTRACT

A multi-loop oscillator which can control variation of an oscillating frequency of a ring oscillator according to variation of a supply voltage is disclosed comprising: first to Nth delay loops, wherein oscillation signal having a predetermined period is generated by selecting one of first to Nth delay loops according to potential variation of a supply voltage. Herein, the multi-loop oscillator further comprises a loop selection section for selecting one loop from among the first to the Nth delay loops, according to potential variation of the supply voltage. Further, the multi-loop oscillator further comprises a supply voltage detection circuit section for detecting variation of the supply voltage, and the supply voltage detection circuit section controls an operation of the loop selection section. In the multi-loop oscillator, an oscillation frequency of the ring oscillator can be adjusted. Accordingly, when the ring oscillator is employed, an abnormal operation of a pumping circuit operating in response to an oscillation signal of the ring oscillator can be considerably reduced.

9 Claims, 5 Drawing Sheets

MULTI-LOOP OSCILLATOR

BACKGROUND OF THE INVENTION

1. Field of the Invention

The present invention relates to a multi-loop oscillator, and more particularly to a multi-loop oscillator which can control variation of an oscillating frequency of a ring oscillator according to variation of a supply voltage.

2. Description of the Prior Art

FIG. 1 is a circuit diagram of a conventional ring oscillator. As shown in FIG. 1, the ring oscillator includes an inverter I0, an even number of inverters I1 to I6, a plurality of capacitors C1 to C7, a NOR gate NOR, and an inverter I7. The inverter I0 receives an enable signal En to invert the received signal, and the inverters I1 to I6 are connected in series with each other. The plurality of capacitors C1 to C7 are connected between each input terminal of the inverters I1 to I6 and a ground, in order to adjust the RC delay of each inverter. The NOR gate NOR employs an input signal of the inverter I0 and an input signal of the inverter I6 as an input. The inverter I7 buffers and outputs an output of the NOR gate NOR.

The conventional ring oscillator constructed as mentioned above forms a single-loop inverter chain having odd number of terminals consisting of even number of inverters and NOR gate performing a function of an inverter.

The reason for forming the single-loop inverter chain is that an input signal passing through one loop is returned as a signal having a pole opposite to the input signal only when the input signal passes through an odd number of inverter terminals. That is, while the enable signal En maintains a high level state, when an input signal at a high level is inputted to the inverter I1, a signal at a low level is outputted from an output terminal of the NOR gate NOR after a predetermined time passes. Further, when a predetermined time passes again, a signal at a high level is outputted from the output terminal of the NOR gate NOR. These steps continue while the enable signal En maintains a high level state. Accordingly, an output signal "out" of the inverter I7 is a pulse signal having a predetermined oscillating frequency.

However, when a supply voltage reduces applied to each inverter constructing the ring oscillator, driving capability of each inverter deteriorates. Accordingly, a signal processing time in an each inverter increases, and this causes a period of the pulse signal outputted from the ring oscillator to increase. That is, the oscillating frequency of the ring oscillator reduces. This reduction of the oscillating frequency causes the charge pumping capability of a pumping circuit (not shown) using the ring oscillator to deteriorate.

In contrast, when the supply voltage increases, the oscillating frequency of the ring oscillator increases. This increase of the oscillating frequency causes the charge pumping capability of the pumping circuit (not shown) using the ring oscillator to increase excessively.

The supply voltage may be a low voltage or a high voltage according to exterior noise or environment. If the oscillating frequency of the ring oscillator is designed in match with low voltage condition, excessive charge pumping phenomenon may occur in most normal voltage states or a high voltage state. Especially, since an oscillation frequency is very shortened in the high voltage state, a pumping operation itself may not normally operate.

SUMMARY OF THE INVENTION

Accordingly, the present invention has been made to solve the above-mentioned problems occurring in the prior art, and it is an object of the present invention to provide a multi-loop oscillator including a loop circuit section having at least one loop circuit and capable of controlling increase or decrease of an oscillating frequency due to the variation of supply voltage by selecting a proper loop circuit from loop circuits in response to variation of supply voltage.

In order to achieve the above objects, according to one aspect of the present invention, there is provided a multi-loop oscillator comprising: first to Nth delay loops, wherein oscillation signal having a predetermined period is generated by selecting one of first to Nth delay loops according to potential variation of a supply voltage.

Herein, the multi-loop oscillator further comprises a loop selection section for selecting one loop from among the first to the Nth delay loops, according to potential variation of the supply voltage.

Further, the multi-loop oscillator further comprises a supply voltage detection circuit section for detecting variation of the supply voltage, and the supply voltage detection circuit section controls an operation of the loop selection section.

In the multi-loop oscillator, the first delay loop is selected and the oscillation signal has a lowest frequency, when the supply voltage exceeds the maximum reference value.

In the multi-loop oscillator, the Nth loop "LOOPn" is selected when the supply voltage is not exceeding than the minimum reference value.

Further, in a detailed embodiment of the present invention, there is provided a multi-loop oscillator comprising: a loop circuit section for forming a plurality of loops for generating oscillation signals having different frequencies in response to an enable signal; a supply voltage detection circuit section for detecting a supply voltage level and generating a plurality of selection signals corresponding to the detected supply voltage level; a loop selection section for selecting one loop from among the plurality of loops in response to the plurality of selection signals, and inverting and outputting an input signal; and an output section for buffering and outputting an oscillation signal of the loop selected by the loop selection section.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
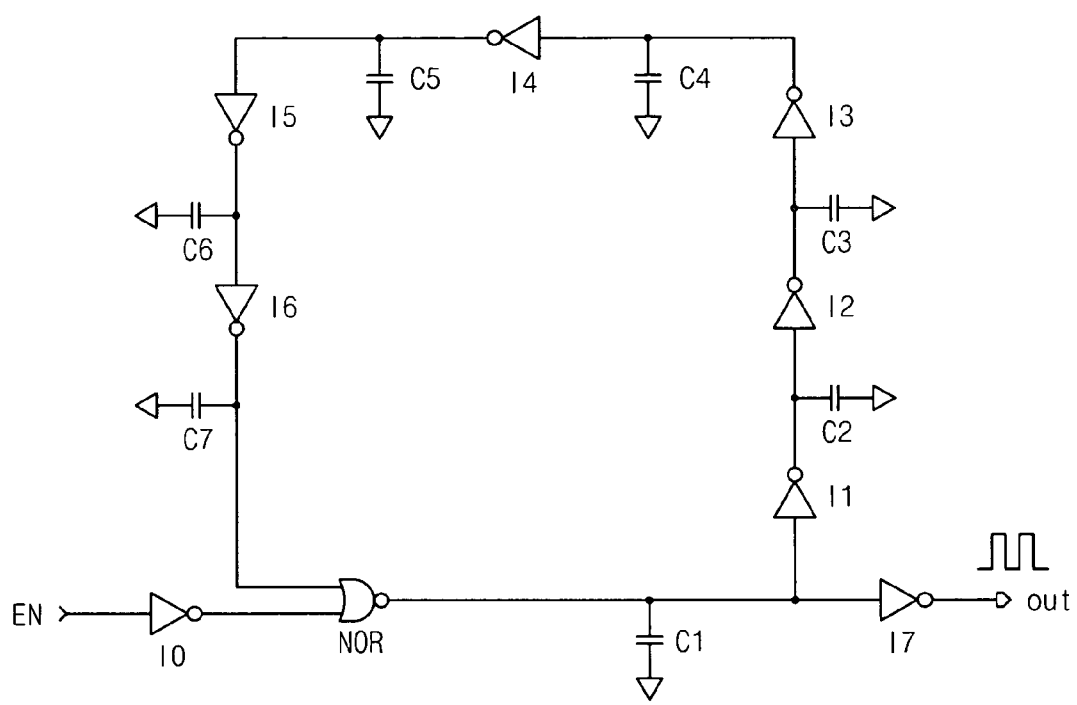
FIG. 1 is a circuit diagram of a conventional ring oscillator.
Figure 2:
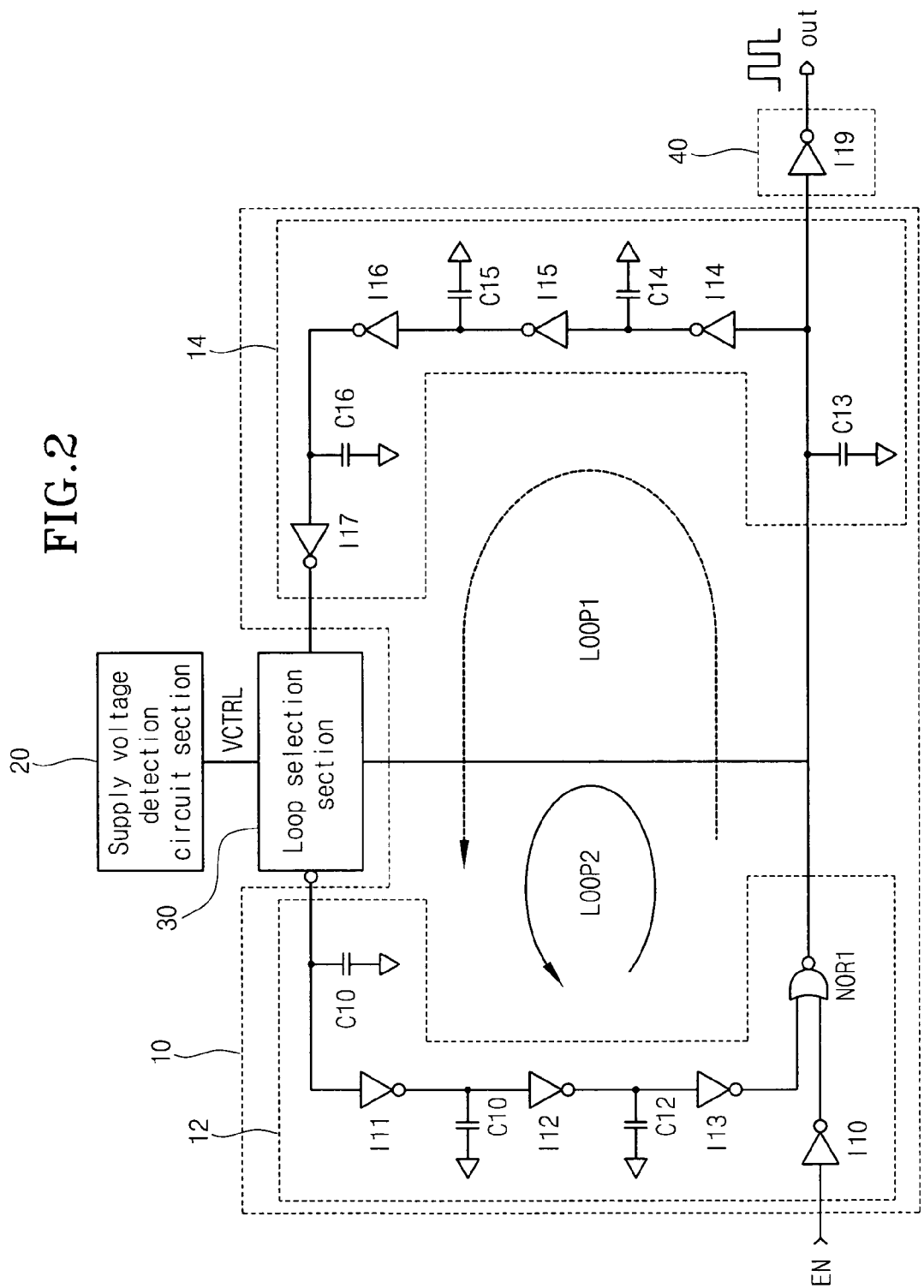
FIG. 2 is a circuit diagram of a dual-loop oscillator according to a first embodiment of the present invention.

FIG. 2 is a circuit diagram of a dual-loop oscillator according to a first embodiment of the present invention. The dual-loop oscillator operates while an enable signal EN is enabled to be at a high level.

The dual-loop oscillator according to the first embodiment of the present invention is a modified ring oscillator having two loops LOOP1 and LOOP2, and includes a loop circuit section 10, a supply voltage detection circuit section 20, a loop selection section 30, and an output section 40.

The loop circuit section 10 includes one loop between a first loop LOOP1 marked by a dotted line and a second loop LOOP2 marked by a solid line. Herein, the first loop LOOP1 is selected when a supply voltage is high and the second loop LOOP2 is selected when a supply voltage is low. That is, the first loop LOOP1 is a loop for generating a low frequency oscillation signal and the second loop LOOP2 is a loop for generating a relatively high frequency oscillation signal in comparison to the oscillation signal of the first loop LOOP1.

A first inverter chain section 12 includes an inverter I10, an odd number of inverters I11 to I13, a NOR gate NOR1, and a plurality of capacitors C10 to C12. The inverter I10 inverts an enable signal EN to output the inverted signal, and the inverters I11 to I13 are connected in series with each other. The NOR gate NOR1 NORs an output signal of the inverter I10 and an output signal of the inverter I13. Each of the capacitors C10 to C12 is connected between each of input terminals of the inverters I11 to I13 and a ground. Herein, the plurality of capacitors C10 to C12 RC-delay each of output signals of the inverters I11 to I13.

A second inverter chain section 14 includes even number of inverter I14 to I17 connected in series with each other, and a plurality of capacitors C13 to C16 connected between each of input terminals of the inverters I14 to I17 and a ground. Herein, the plurality of capacitors C13 to C16 RC-delay each of output signals of the inverters I14 to I17.

The supply voltage detection circuit section 20 is a circuit for detecting variation in a supply voltage VDD and will be described later.

The loop selection section 30 is a switching means which responds a selection signal VCTRL from the supply voltage detection circuit section 20 and then selects one loop between the first loop LOOP1 and the second loop LOOP2. The switching means is constructed by a 2×1 multiplexer, a decoder, etc.

The output section 40 is constructed by an inverter I19 which inverts and outputs an output signal of the NOR gate NOR1.

Figure 3:
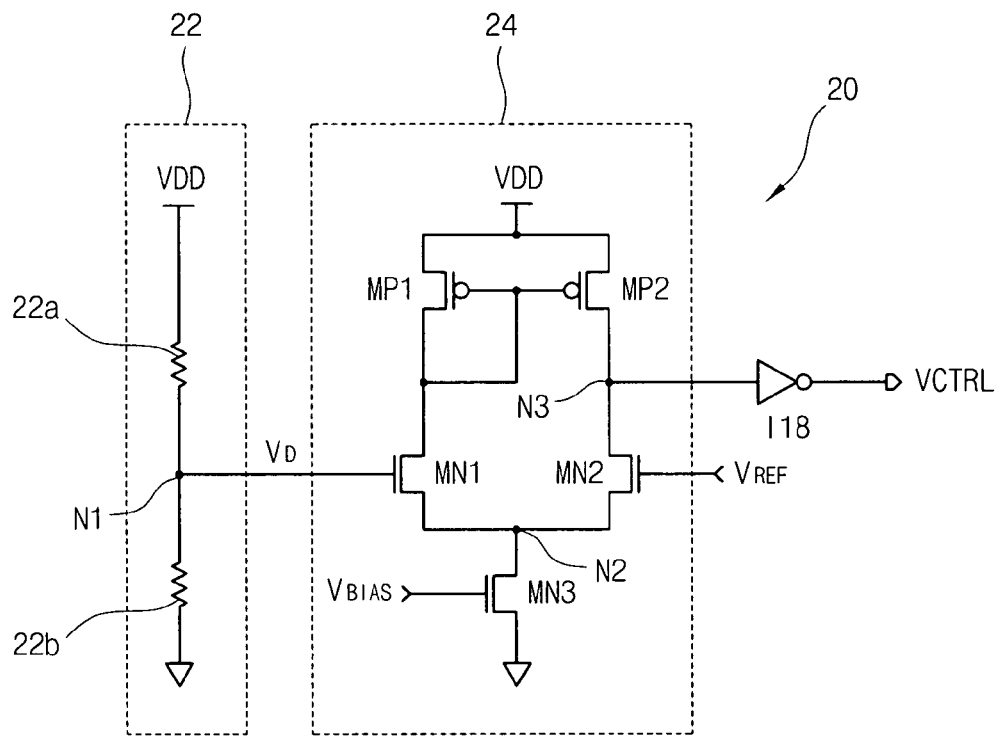
FIG. 3 is a detailed circuit diagram of the supply voltage detection circuit section according to the first embodiment of the present invention.

FIG. 3 is a detailed circuit diagram of the supply voltage detection circuit section 20 according to the first embodiment of the present invention.

As shown in FIG. 3, the supply voltage detection circuit section 20 includes a voltage distribution section 22, a comparison circuit section 24, and an inverter I18. The voltage distribution section 22 divides the supply voltage VDD and generates a divided voltage $V_D$. The comparison circuit section 24 receives a reference voltage $V_{REF}$, compares the divided voltage $V_D$ with the reference voltage $V_{REF}$, and generates a comparison signal. The inverter I18 inverts the comparison signal of the comparison circuit section 24 and outputs the inverted signal as a selection signal VCTRL.

The voltage distribution section 22 includes resistors 22a and 22b coupled in series with each other between the supply voltage VDD and a ground. Further, the voltage distribution section 22 provides an input terminal of the comparison circuit section 24 with the divided voltage $V_D$ generated through a connection node N1 of the resistors 22a and 22b. Herein, a voltage at the connection node N1 may be adjusted by values of the resistors 22a and 22b.

The comparison circuit section 24 is a differential amplifier and includes a first and a second PMOS transistor MP1 and MP2, a first NMOS transistor MN1, a second NMOS transistor MN2, and a third NMOS transistor MN3. The first and the second PMOS transistor MP1 and MP2 form a current mirror, and the first NMOS transistor MN1 receives the divided voltage $V_D$ from the voltage distribution section 22. The second NMOS transistor MN2 receives the reference voltage $V_{REF}$ from a reference voltage generator (not shown). The third NMOS transistor MN3 is driven by a bias voltage $V_{BIAS}$, to form a current sink for sinking electric current, which flows in the current mirror, to a ground.

In the comparison circuit section 24, the supply voltage VDD is provided to the first and the second PMOS transistor MP1 and MP2 through each one end of the first and the second PMOS transistor MP1 and MP2. The other end of the first PMOS transistor MP1 is coupled to one end of the first NMOS transistor MN1, and the other end of the second PMOS transistor MP2 is coupled to one end of the second NMOS transistor MN2. Further, the other end of the first NMOS transistor MN1 is coupled to the other end of the first NMOS transistor MN2 to form a common node N2. One end of the third NMOS transistor MN3 is coupled to the common node N2. Further, a connection point between the second PMOS transistor MP2 and the second NMOS transistor MN2 forms an output node N3, and the comparison signal is outputted through the output node N3.

Figure 4:
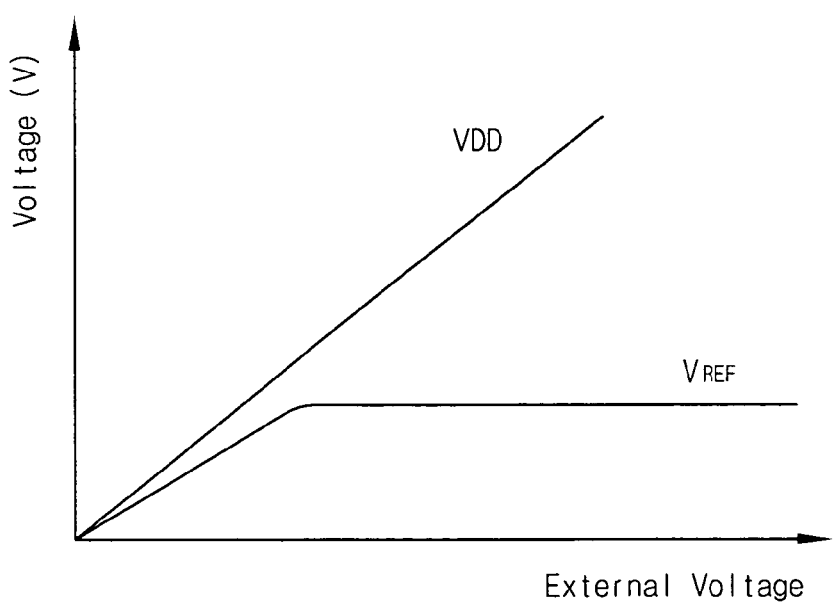
FIG. 4 is a graph showing the reference voltage according to the first embodiment of the present invention.

FIG. 4 is a graph showing the reference voltage according to the first embodiment of the present invention. In FIG. 4, a reference mark VDD represents a supply voltage, and a reference mark $V_{REF}$ represents a reference voltage. For reference, the supply voltage VDD used in FIGS. 3 and 4 is also utilized in inverters forming a ring oscillator.

Hereinafter, an operation of the dual-loop oscillator according to the first embodiment of the present invention will be described with reference to FIGS. 2 to 4.

First, a state in which the supply voltage VDD is stable will be described. In this case, a potential of the connection node N1 in the voltage distribution section 22 maintains a state higher than the reference voltage $V_{REF}$. Accordingly, the comparison circuit section 24 outputs a comparison signal at a high level, the selection signal VCTRL of the supply voltage detection circuit section 20 comes into a low level state, and the loop selection section 30 selects the first loop LOOP1. As a result, the frequency of the oscillation signal "out" outputted from the ring oscillator is lowered.

Next, a case in which the supply voltage VDD has variation due to external factors (e.g. when the supply voltage VDD is lowered) will be described. In this case, the potential of the connection node N1 in the voltage distribution section 22 is lowered than the reference voltage $V_{REF}$. Accordingly, the comparison circuit section 24 outputs a comparison signal at a low level, the selection signal VCTRL of the supply voltage detection circuit section 20 comes into a high level state, and the loop selection section 30 selects the second loop LOOP2.

As a result, the frequency of the oscillation signal "out" outputted from the ring oscillator is heightened.

In the present invention as described above, when the supply voltage VDD is low, the oscillating frequency of the ring oscillator increases. In contrast, when the supply voltage VDD is high, the oscillating frequency of the ring oscillator decreases. Accordingly, the signal outputted from the ring oscillator can have a stable oscillation frequency regardless of variation in the supply voltage.

Figure 5:
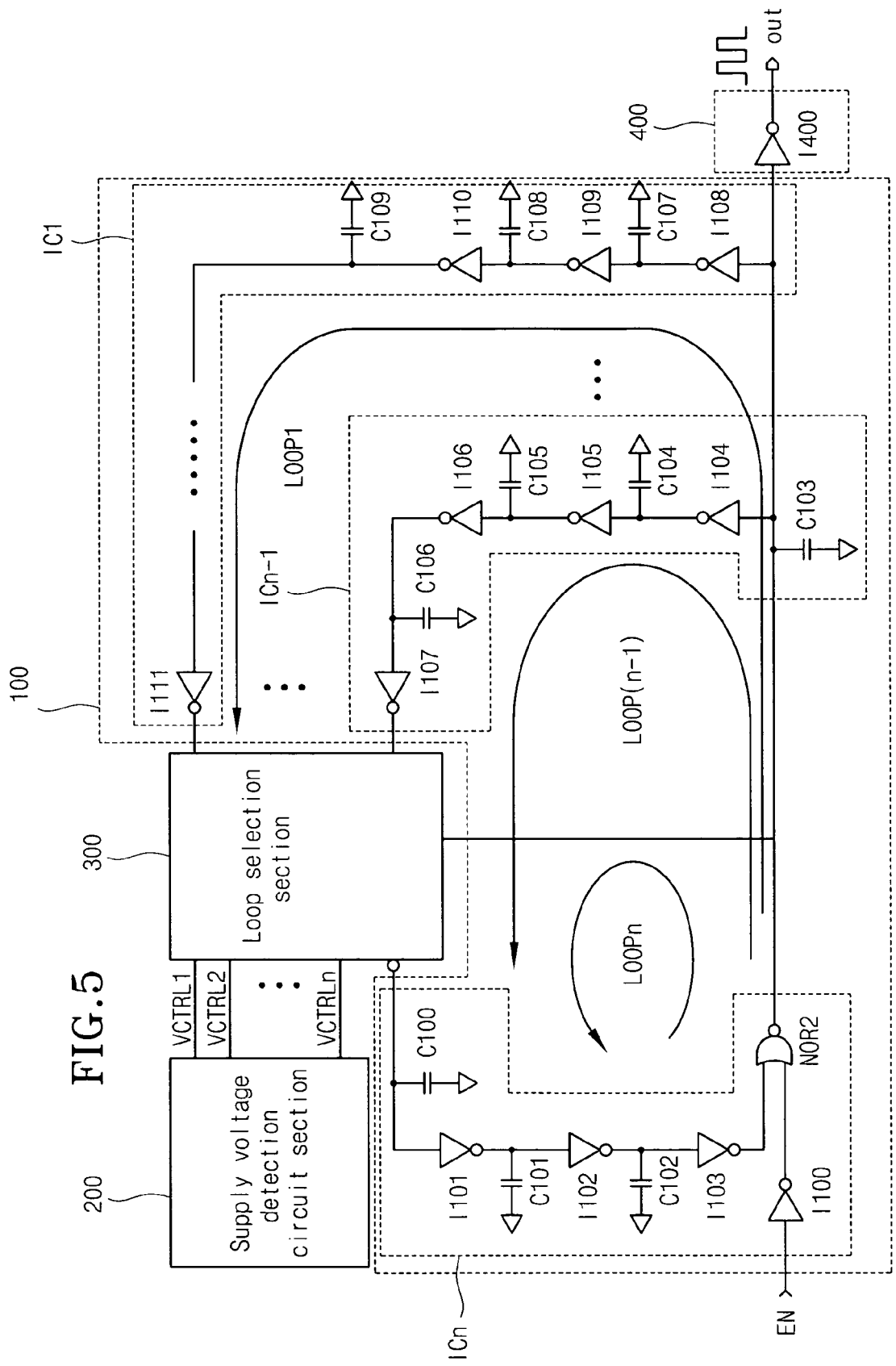
FIG. 5 is a circuit diagram of a multi-loop oscillator according to a second embodiment of the present invention.

FIG. 5 is a circuit diagram of a multi-loop oscillator according to a second embodiment of the present invention. The multi-loop oscillator selects one loop from among "n" number of loops LOOP1 to LOOPn according to variation of a supply voltage, and outputs an oscillation signal having a corresponding frequency.

The multi-loop oscillator according to the second embodiment includes a loop circuit section 100, a supply voltage detection circuit section 200, a loop selection section 300, and an output section 400.

The loop circuit section 100 includes "n" number of loops LOOP1 to LOOPn having different signal transmission paths, in order to generate oscillation signals having different frequencies. Herein, loop delay times of the "n" number of loops LOOP1 to LOOPn are different from each other.

The Nth inverter chain section $IC_n$ includes inverters I101 to I103, capacitors C100 to C102, a first inverter I100, and a NOR gate NOR2. The inverters I101 to I103 are connected in series with each other. Each of the capacitors C100 to C102 is connected between each of output terminals of the inverters I101 to I103 and a ground. The first inverter I100 inverts and outputs an enable signal En. The NOR gate NOR2 NORs an output signal of the Nth inverter chain section $IC_n$ and an output signal of the first inverter I100. Herein, the NOR gate NOR2 NORs functions as an inverter.

The (N−1)th inverter chain section $IC_{n-1}$ includes inverters I104 to I107 connected in series with each other, and a plurality of capacitors C103 to C106 connected between each of input terminals of the inverters I104 to I107 and a ground.

The first inverter chain section $IC_1$ employs an output of the NOR gate NOR2 as an input and includes inverters I108 to I111 connected in series with each other, and capacitors C107 to C109 connected between each input terminal of the inverters I108 to I111 and a ground.

The supply voltage detection circuit section 200 detects a voltage level of the supply voltage VDD to generate a plurality of selection signals $VCTRL_1$ to $VCTRL_n$.

The loop selection section 300 is a switching means for selecting one loop from among the "n" number of loops LOOP1 to LOOPn in response to the selection signals $VCTRL_1$ to $VCTRL_n$ from the supply voltage detection circuit section 200.

The output section 400 includes an inverter I400 which inverts and outputs the output signal of the NOR gate NOR2.

Figure 6:
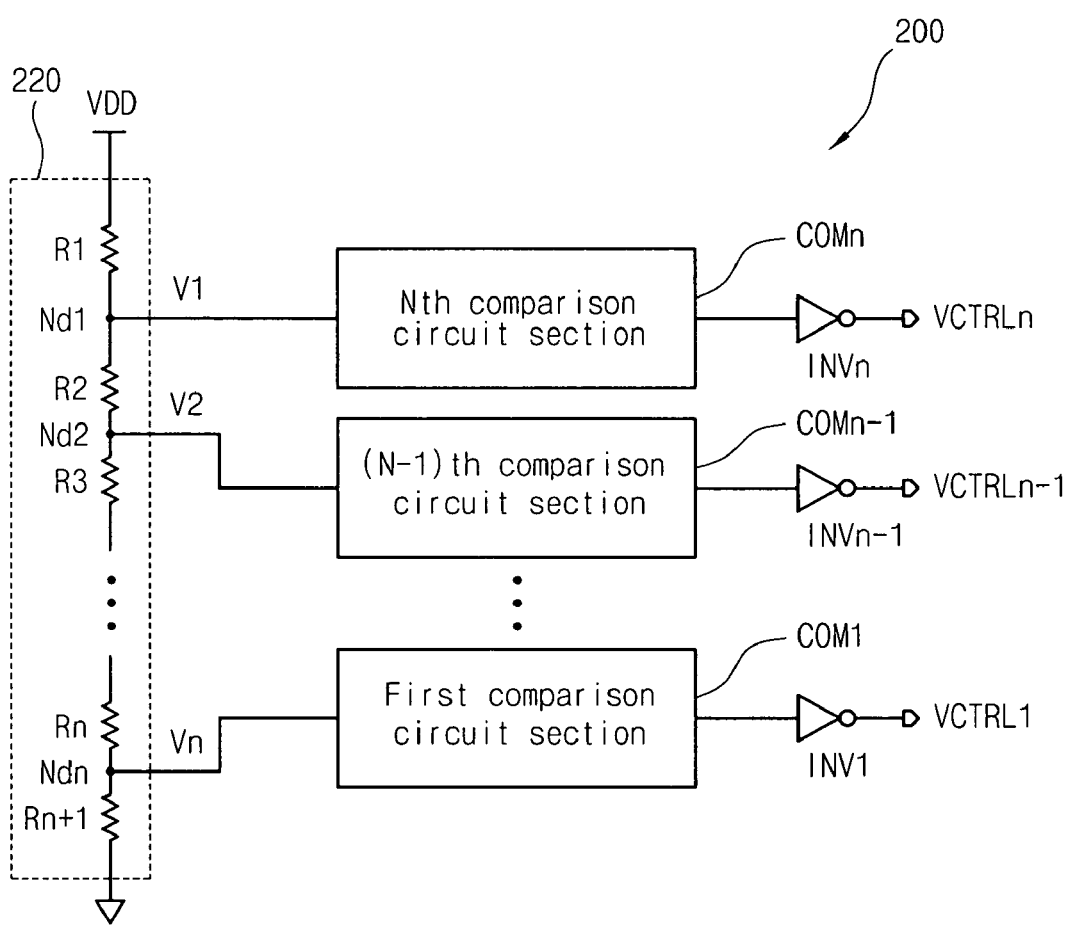
FIG. 6 is a circuit diagram of the supply voltage detection circuit section according to the second embodiment of the present invention.

FIG. 6 is a detailed circuit diagram of the supply voltage detection circuit section 200 according to the second embodiment of the present invention. As shown in FIG. 6, the supply voltage detection circuit section 200 includes a voltage distribution section 220, a plurality of comparison circuit sections $COM_1$ to $COM_n$, and a plurality of inverters $InV_1$ to $InV_n$. The voltage distribution section 220 divides a supply voltage VDD to generate a plurality of divided voltages $V_1$ to $V_n$, in order to detect variation of the supply voltage VDD. Each of the comparison circuit sections $COM_1$ to $COM_n$ receives a reference voltage $V_{REF}$, compares the plurality of divided voltages $V_1$ to $V_n$ with the reference voltage $V_{REF}$, and generates a comparison signal. The inverters $InV_1$ to $InV_n$ invert the comparison signals of the comparison circuit sections $COM_1$ to $COM_n$ to output a plurality of selection signals $VCTRL_1$ to $VCTRL_n$.

The voltage distribution section 220 includes a plurality of resistors $R_1$ to $R_{n+1}$ connected in series with each other between the supply voltage VDD and a ground. Further, the voltage distribution section 220 provides input terminals of corresponding comparison circuit sections $COM_1$ to $COM_n$ with a plurality of divided voltages $V_1$ to $V_n$ generated through connection nodes $Nd_1$ to $Nd_n$ in the plurality of resistors $R_1$ to $R_{n+1}$. Herein, the divided voltages $V_1$ to $V_n$ at the connection nodes $Nd_1$ to $Nd_n$ can be adjusted by values of the plurality of resistors $R_1$ to $R_{n+1}$.

Since the comparison circuit sections $COM_1$ to $COM_n$ has the same construction as that of the comparison circuit section 24 in FIG. 3, a detailed description regarding the comparison circuit sections $COM_1$ to $COM_n$ will be omitted.

In the second embodiment of the present invention, the plurality of selection signals $VCTRL_1$ to $VCTRL_n$ are determined as shown in table 1 according to variation of the supply voltage.

TABLE 1

| VCTRL1 | VCTRL2 | VCTRL3 | ... | VCTRLn | 선택 루프 |
|--------|--------|--------|-----|--------|----------|
| L | L | L | ... | L | LOOP1 |
| H | L | L | ... | L | LOOP2 |
| H | H | L | ... | L | LOOP3 |
| . | . | . | ... | . | . |
| . | . | . | ... | . | . |
| H | H | H | ... | H | LOOPn |

Hereinafter, one example of an operation of the multi-loop oscillator, constructed as above, according to the second embodiment of the present invention will be described.

For instance, when the supply voltage VDD is in a stable state (i.e. when the supply voltage VDD is larger than a predetermined voltage level), potentials of the connection nodes $Nd_1$ to $Nd_n$ in the voltage distribution section 220 maintain a state higher than the reference voltage $V_{REF}$. Accordingly, the comparison circuit sections $COM_1$ to $COM_n$ output comparison signals at a high level, the selection signal $VCTRL_1$ to $VCTRL_n$ of the supply voltage detection circuit section 200 come into a low level state as shown in table 1, and the loop selection section 300 selects the first loop LOOP1. As a result, a low frequency oscillation signal having the lowest frequency is generated from an output terminal of the ring oscillator.

Next, when there is variation in the supply voltage VDD due to external factors (e.g. when the supply voltage VDD is lowered), the loop selection section 300 selects one loop from among the second loops "LOOP2" to the Nth loop "LOOPn".

For instance, when the supply voltage VDD is reduced to the lowest level, potentials of the connection nodes $Nd_1$ to $Nd_n$ in the voltage distribution section 220 maintain a state lower than the reference voltage $V_{REF}$. Accordingly, the comparison circuit sections $COM_1$ to $COM_n$ output comparison signals at a low level, the selection signal $VCTRL_1$ to $VCTRL_n$ of the supply voltage detection circuit section 200 come into a high level state as shown in table 1, and the loop selection section 300 selects the Nth loop "LOOPn". As a result, a high frequency oscillation signal having the highest frequency is generated from an output terminal of the ring oscillator.

When there is variation in the supply voltage as described above, the present invention provides a plurality of loops which can adjust an oscillation period of the ring oscillator in response to the variation. Accordingly, when the ring oscillator of the present invention is used, a stable oscillation signal can be outputted.

In the present invention as described above, an oscillation frequency of the ring oscillator can be adjusted. Accordingly, when the ring oscillator of the present invention is employed, an abnormal operation of a pumping circuit operating in response to an oscillation signal of the ring oscillator can be considerably reduced.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A multi-loop oscillator comprising:
   first to Nth delay loops wherein oscillation signal having a predetermined period is generated by selecting one of the first to Nth delay loops according to potential variation of supply voltage;
   a loop selection section for selecting one loop from among the first to the Nth delay loops, according to potential variation of supply voltage; and
   a supply voltage detection circuit section for detecting variation of supply voltage, and the supply voltage detection circuit section controls an operation of the loop selection section.

2. The multi-loop oscillator as claimed in claim 1, wherein a delay time is gradually reduced from the first delay loop to the Nth delay loop.

3. The multi-loop oscillator as claimed in claim 2, wherein the first delay loop is selected and the oscillation signal has a lowest frequency, when the supply voltage exceeds the maximum reference value.

4. The multi-loop oscillator as claimed in claim 3, wherein one loop from among the second loops "LOOP2" to the Nth loop "LOOPn" is selected when the supply voltage is less than the maximum reference value.

5. The multi-loop oscillator as claimed in claim 4, wherein the Nth loop "LOOPn" is selected when the supply voltage is not exceeding the minimum reference value.

6. The multi-loop oscillator as claimed in claim 1, wherein each of the first to Nth delay loops includes an inverter chain.

7. The multi-loop oscillator as claimed in claim 6, wherein the supply voltage is used as a driving voltage of the inverter chain.

8. A multi-loop oscillator comprising:
   a loop circuit section for forming a plurality of loops for generating oscillation signals having different frequencies in response to an enable signal;
   a supply voltage detection section for detecting a supply voltage level and generating a plurality of selection signals corresponding to the detected supply voltage level;
   a loop selection section for selecting one loop from among a plurality of loops in response to the plurality of selection signals, and inverting and outputting an input signal; and
   an output section for buffering and outputting an oscillation signal of the loop selected by the loop selection section.

9. The multi-loop oscillator as claimed in claim 8, wherein each of the plurality of loops is constructed by an inverter chain.

* * * * *